(12) United States Patent
Chang et al.

(10) Patent No.: US 9,093,373 B2
(45) Date of Patent: Jul. 28, 2015

(54) CONDUCTIVE DIFFUSION BARRIER STRUCTURE FOR OHMIC CONTACTS

(71) Applicant: Taiwan Semiconductor Manufacturing Co., Ltd., Hsin-Chu (TW)

(72) Inventors: Chin-Chia Chang, Zhongli (TW); Han-Wei Yang, Hsinchu (TW); Chen-Chung Lai, Guanxi Township (TW); Kang-Min Kuo, Zhubei (TW); Bor-Zen Tien, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 58 days.

(21) Appl. No.: 13/965,294

(22) Filed: Aug. 13, 2013

(65) Prior Publication Data
US 2015/0048507 A1 Feb. 19, 2015

(51) Int. Cl.
| H01L 29/66 | (2006.01) |
| H01L 21/02 | (2006.01) |
| H01L 21/265 | (2006.01) |
| H01L 27/146 | (2006.01) |
| H01L 29/78 | (2006.01) |
| H01L 21/762 | (2006.01) |

(52) U.S. Cl.
CPC ........ *H01L 21/265* (2013.01); *H01L 21/76286* (2013.01); *H01L 27/1463* (2013.01); *H01L 29/6659* (2013.01); *H01L 29/7833* (2013.01)

(58) Field of Classification Search
CPC ............ H01L 21/265; H01L 21/76286; H01L 27/1463; H01L 29/6659; H01L 29/7833
USPC .......................................... 257/483, 484, 486
See application file for complete search history.

(56) References Cited

U.S. PATENT DOCUMENTS

| 2007/0029589 A1* | 2/2007 | Bahl et al. | 257/290 |
| 2010/0065905 A1* | 3/2010 | Pan | 257/330 |

* cited by examiner

*Primary Examiner* — Nicholas Tobergte
(74) *Attorney, Agent, or Firm* — Eschweiler & Associates, LLC

(57) ABSTRACT

An integrated circuit includes a p-type region formed beneath a surface of a semiconductor substrate, and an n-type region formed beneath the surface of the semiconductor substrate. The n-type region meets the p-type region at a p-n junction. A diffusion barrier structure, which is beneath the surface of the semiconductor substrate and extends along a side of the p-n junction, limits lateral diffusion between the p-type region and n-type region.

20 Claims, 4 Drawing Sheets

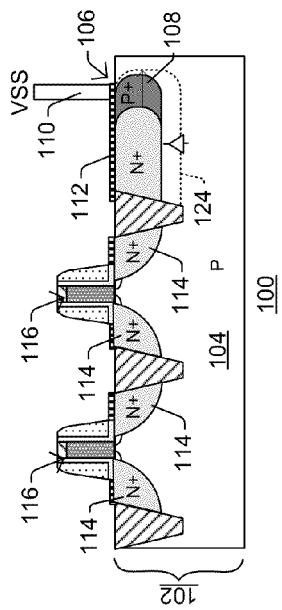
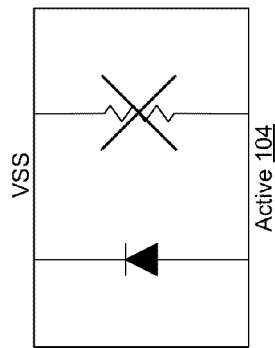
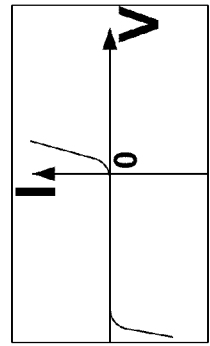
FIG. 2A  FIG. 2B  FIG. 2C
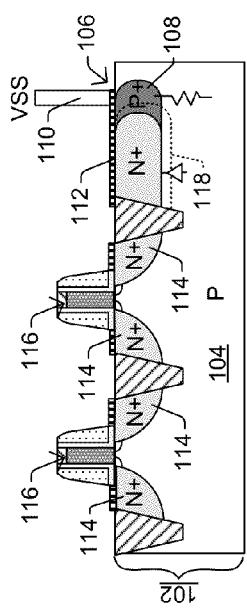
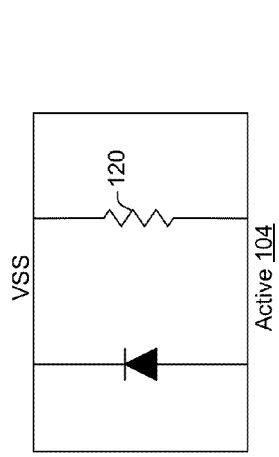
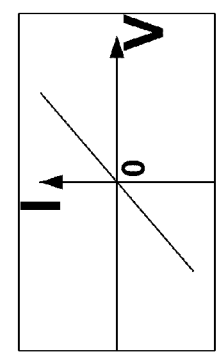
FIG. 1A  FIG. 1B  FIG. 1C

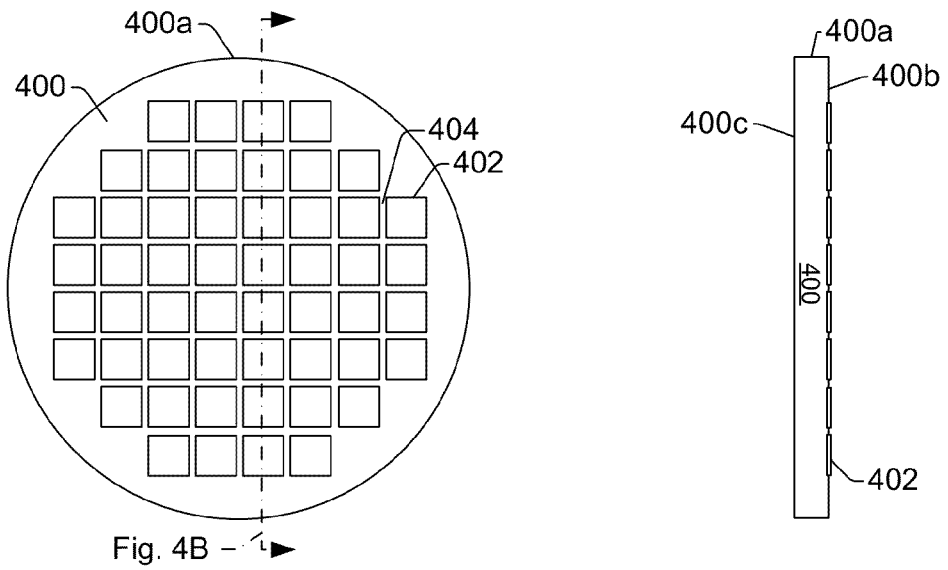
FIG. 4A   FIG. 4B
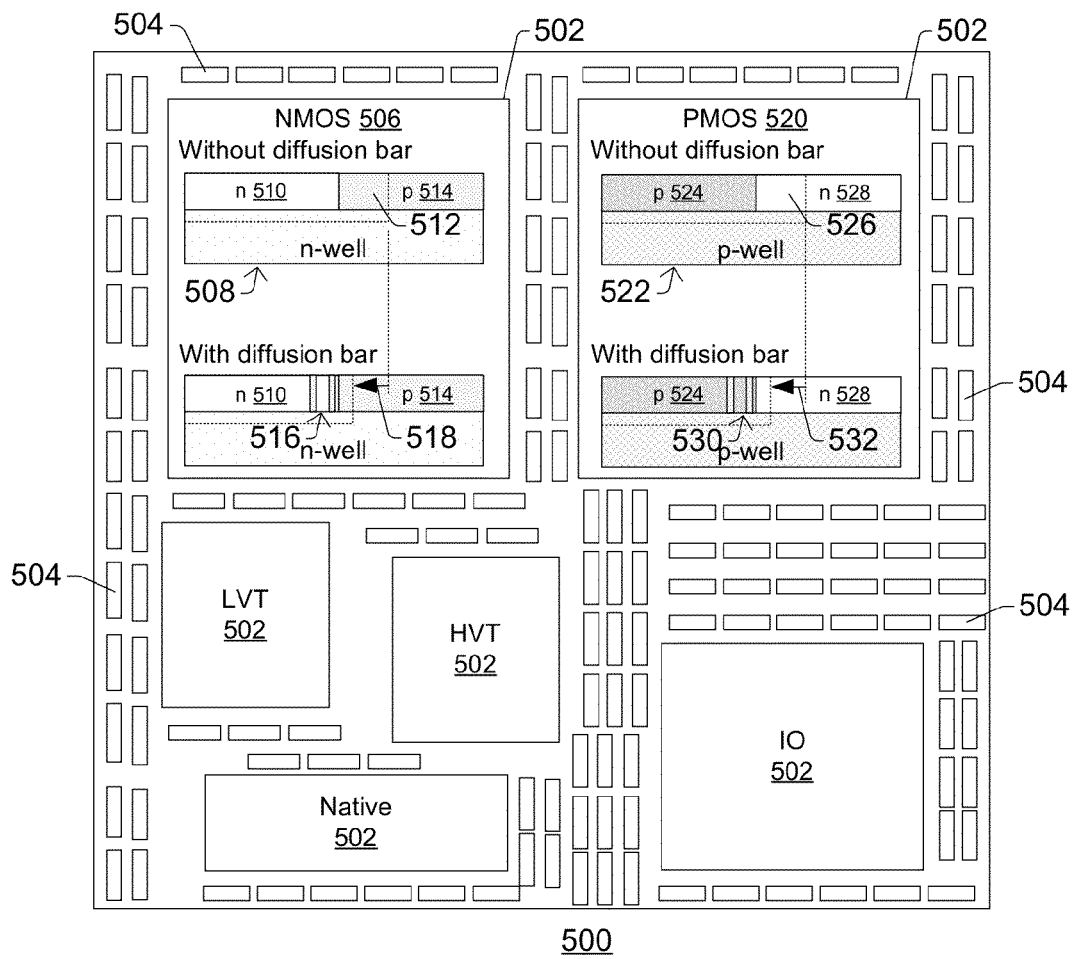
FIG. 5

US 9,093,373 B2

CONDUCTIVE DIFFUSION BARRIER STRUCTURE FOR OHMIC CONTACTS

BACKGROUND

To help streamline the manufacturing process of such devices on a single integrated circuit, the inventors have developed improved manufacturing processes.

BRIEF DESCRIPTION OF THE DRAWINGS

FIGS. 1A-1C illustrate an integrated circuit that has a desirable ohmic body contact.

FIGS. 2A-2C illustrate an integrated circuit where excess lateral diffusion has eliminated the ohmic body contact such that non-ohmic coupling occurs for the body contact.

FIGS. 4A-B illustrates some embodiments of semiconductor wafer.

FIG. 5 illustrates some embodiments of a die that includes a diffusion barrier structures to limit diffusion and promote ohmic contacts.

DETAILED DESCRIPTION

Figure 3A:
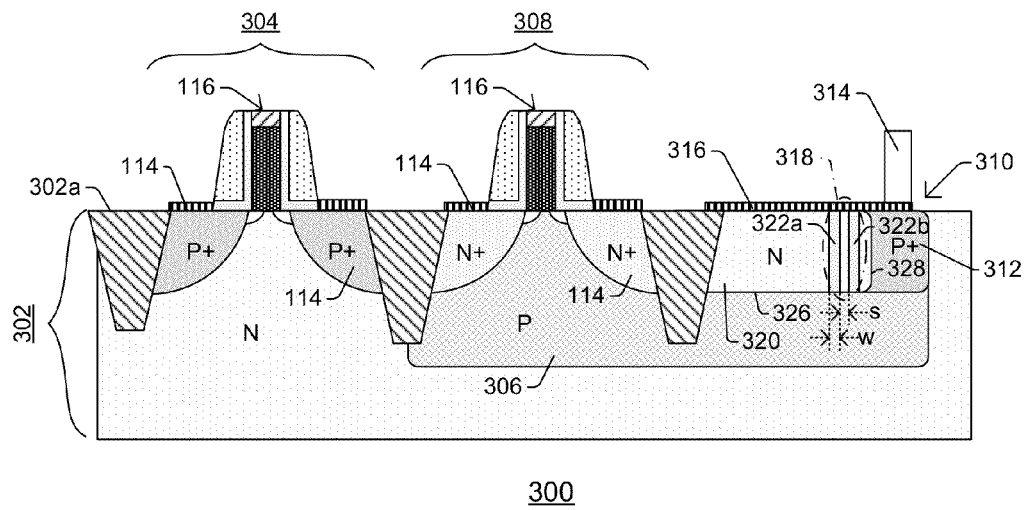
FIG. 3A illustrates some embodiments of a cross-sectional view of an integrated circuit having a lateral diffusion barrier structure to limit lateral diffusion.

One or more implementations of the present invention will now be described with reference to the attached drawings, wherein like reference numerals are used to refer to like elements throughout. The drawings are not drawn to scale.

FIG. 1A shows a cross-sectional view of part of an integrated circuit (IC) 100. The IC 100 is formed on a semiconductor substrate 102 which includes an active region 104 having a first conductivity type. In the illustrated example, the active region 104, which acts as a body region for transistor devices formed on IC 100, is shown as being p-type, although the conductivities of the illustrated regions could be flipped such that the active region 104 could also be n-type in other embodiments. To properly bias the active region 104, a substrate contact 106 is present on the IC. The substrate contact 106 includes a highly doped p+ region 108 in substrate 102 and a vertical metal contact structure 110 coupled to the p+ region 108 through a silicide 112. Thermal processing can cause lateral diffusion of regions having a second conductivity type 114 (e.g., N+ source drain regions about opposite ends of gate structure 116), such that dopants from region 114 diffuse laterally outwards toward highly doped p+ region 108 (as shown by dashed line 118). In normal/desired processes, this lateral diffusion 118 stops early enough to leave the highly doped p+ region 108 in direct contact with the underlying active region 104. In these situations, as shown in FIG. 1B, the p+ region 108 and contact 110 represent a resistance 120 between VSS and the underlying p-type body region 104, such that the electrical coupling between VSS and the body region 104 is said to be an ohmic coupling 122 as shown in FIG. 10.

Unfortunately, as the inventors have appreciated and as shown in FIG. 2A, in real world scenarios the lateral diffusion of the n+ dopants from 114 may extend outward further than expected (see dashed line 124). This can be caused, for example, if thermal conditions are higher than expected during processing of the IC 100, such as if annealing temperatures are slightly higher than expected because of small changes in manufacturing conditions. In the case of FIG. 2A, for example, the N+ dopants have now moved vertically under the highly doped p+ region 108 and laterally past the p+ region 108 (see dashed line 124), so as to isolate the p+ region 108 from the underlying body region 104. As shown in FIGS. 2B-2C, the effect of this undesired excess diffusion is that the resistor 120 previously formed between the body region 104 and the contact structure 110 is "pinched off". Thus, the resultant contact structure of FIG. 2A is no longer ohmic in nature, but rather exhibits diode functionality in some respects, as shown in FIGS. 2B-2C. This can impair the operation of the IC 100, possibly rendering it useless, particularly if multiple substrate contacts on the IC have this issue.

In view of these concerns, the present disclosure provides techniques to reduce the lateral diffusion of dopants at predetermined locations on a semiconductor wafer. In particular, the inventors have developed diffusion barrier structures which have a vertical orientation that limits lateral diffusion in semiconductor wafers. By limiting this lateral diffusion, these diffusion barrier structures can impede excess lateral diffusion that can otherwise "pinch off" an ohmic active or well region contact. Further, when manufactured out of conductive materials, these diffusion barrier structures can provide a parallel conductive path between a metal contact and an underlying active or well region, which promotes ohmic connections. Hence, the diffusion barrier structures can improve the yield of wafers in the fabrication facility over conventional approaches.

Figure 3B:
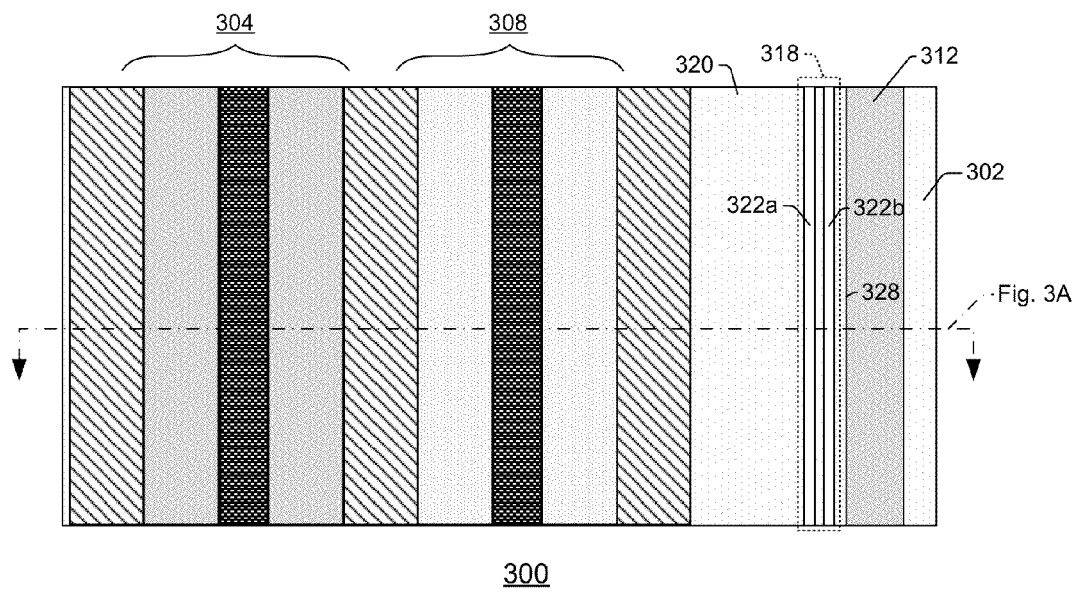
FIG. 3B illustrates some embodiments of a top view of FIG. 3A's integrated circuit.

FIG. 3A (cross-sectional view) and FIG. 3B (top view) collectively depict an integrated circuit (IC) 300 that includes a diffusion barrier structure 318 in accordance with some embodiments. For clarity, FIG. 3B's top view does not illustrate all layers and/or regions illustrated in FIG. 3A. Further, other un-illustrated embodiments may also include additional layers and/or regions not shown in FIGS. 3A-3B and/or may not include all layers and/or regions shown in FIG. 3A-3B.

The illustrated IC 300 is formed on a semiconductor substrate 302 which has a first conductivity type (e.g., n-type) and which acts as a body region for transistors 304 having a second conductivity type (e.g., p-type MOSFETs). An active region 306, such as a well region, is formed in the substrate 302 and acts as a body region for transistors 308 having the first conductivity type (e.g., n-type MOSFETs). Although the illustrated substrate 302 acts as a body region for transistors 304 having the second conductivity type, a separate well region (not shown) having the first conductivity type could also form the body region of the transistors 304. Further, although the illustrated example shows the substrate 302 as being n-type and the active region 306 being p-type, the conductivities of the illustrated regions could be flipped such that the substrate 302 is p-type and active region 306 is n-type.

To properly bias the active region 306, a substrate contact 310 is present on the IC 300. The substrate contact 310 includes a highly doped p+ region 312 in substrate 302 and a vertical metal contact structure 314 coupled to the p+ region 312 through a silicide 316. To limit or prevent excess lateral diffusion, a diffusion barrier structure 318 can extend vertically from an upper substrate surface 302a to a first p-n junction 325, and is arranged near an edge of a second p-n junction 328 (e.g., between p+ region 312 and n-type region 320). The illustrated diffusion barrier structure 318, which is formed in n-type region 320, is made up of one or more diffusion bars 322 whose dopant concentration and/or dopant type differs from that of the surrounding n-type region 320. For example, the diffusion bars 322 can be doped lightly n-type (e.g., n-), relative to that of n-type region; or the diffusion bars 322 can be doped p-type. This can be achieved, for example, by providing a mask over the diffusion bars 322 while the n-type region 320 is implanted (thereby leaving the diffusion bars n-), or by leaving the area over the diffusion bars 322 un-masked while the p+ region 312 is implanted.

These diffusion bars 322 can slow lateral diffusion of n-type dopants from the n-type region 320 towards p+ region 312. Thus, compared to conventional approaches where excess lateral diffusion could extend past p+ doped region 312, thereby "pinching off" a resistor between contact 314 and active/body region 306, the illustrated device with diffusion barrier structure 318 stops or slows diffusion prior to the p+ region 312. Hence, the diffusion barrier structure 318 helps stop the lateral diffusion early enough to leave the highly doped p+ region 312 in direct contact with the underlying active region 306, such that the electrical coupling between contact 314 (e.g., VSS) and the body region 306 is said to be an ohmic coupling.

Further, when doped the with the same conductivity type as the underlying well 306, the diffusion bars 322 can also form another conductive path between the contact 310 and the active region 306 which also helps to retain an ohmic resistance between the contact 310 and active region 306, even at very small geometries.

Although FIGS. 3A-3B show an example where the diffusion barrier structure 318 includes two diffusion barrier bars 322a, 322b extending vertically from an upper substrate surface to near a first p-n junction 326 at which p-well 306 and n-region 320 meet, it will be appreciated that any number of diffusion bars can be present. The exact number of diffusion bars to be used depends on the precise application. Typically, using more diffusion bars provides better reduction or stoppage of lateral diffusion, but at the same time consumes more area on the integrated circuit. Conversely, using fewer diffusion bars uses less area on the IC, but correspondingly slows diffusion to a lesser extent than if more diffusion bars were to be used.

The diffusion bars 322 can take different forms depending on the implementation. In some embodiments, for example, the diffusion bars 322 can have widths (w) of greater than or equal to 30 nm, and neighboring diffusion bars can be spaced apart from one another by a spacing (s) of 20 nm or more. The diffusion bars can each have equal widths in some implementations, although they can also have different widths. Similarly, the spacings between neighboring diffusion bars can be equal in some implementations, but can also differ from one another in other implementations.

Further, although FIGS. 3A-3B were discussed as having lightly n-doped (e.g., n-) diffusion bars or p-type doped diffusion bars arranged within a more heavily doped n-region 320, in other embodiments this doping convention can be reversed. Thus, lightly-p-doped (e.g., p-) diffusion bars or n-type doped diffusion bars can be arranged within a more heavily doped p-region 320, which is adjacent to a highly doped n-region 312 (e.g., n+) that acts as a substrate or well contact.

For reference, FIGS. 4A-4B, which are now briefly discussed, shows a semiconductor wafer 400 that includes a number of die 402. FIGS. 4A-B's wafer 400 has a circumferential edge 400a that bounds first and second wafer faces 400b, 400c. On the first face 400b, semiconductor devices such as transistors, diodes, and the like, are arranged as a series of die (e.g., 402). The semiconductor devices are built up by forming alternating conducting and insulating layers, and performing photolithography to pattern these layers. Ions are also implanted into the wafer at various times to form device features. After the fabrication process is complete, the wafer 400 is cut along scribe lines 404 between neighboring dies, such that each die corresponds to a separate integrated circuit.

FIG. 5 shows a more detailed view of a die 500 which has active circuitry regions 502 made up of p-type regions and n-type regions, which are formed in the substrate. Test or process characterization structures 504 are arranged between active circuitry regions 502. For n-type devices 506 (e.g., transistor 308 in FIG. 3A), excess lateral diffusion of n-type dopants can cause reliability issues. For example, for a device without a diffusion bar in place (508), lateral diffusion of n-type dopants can move from an n-type region 510 to create a counter-doped region 512 within adjacent p-type region 514, possibly leading to poor electrical well or active region connections. By including a diffusion barrier structure 516 near the p-n junction at which the n-region 510 meets the p-region 514, lateral diffusion of the n-type dopants is reduced by an amount 518 compared to when there is no diffusion bar in place. Similarly, for p-type devices 520, excess lateral diffusion of p-type dopants can lead to reliability issues. For example, for a device without a diffusion bar in place (522), lateral diffusion of p-type dopants can move from a p-type region 524 to create a counter-doped region 526 within adjacent n-type region 528, possibly leading to poor electrical well or active region connections. By including a diffusion barrier structure 530 near the p-n junction at which the n-region 528 meets the p-region 524, lateral diffusion of the p-type dopants is reduced by an amount 532 compared to when there is no diffusion bar in place.

Figure 6:
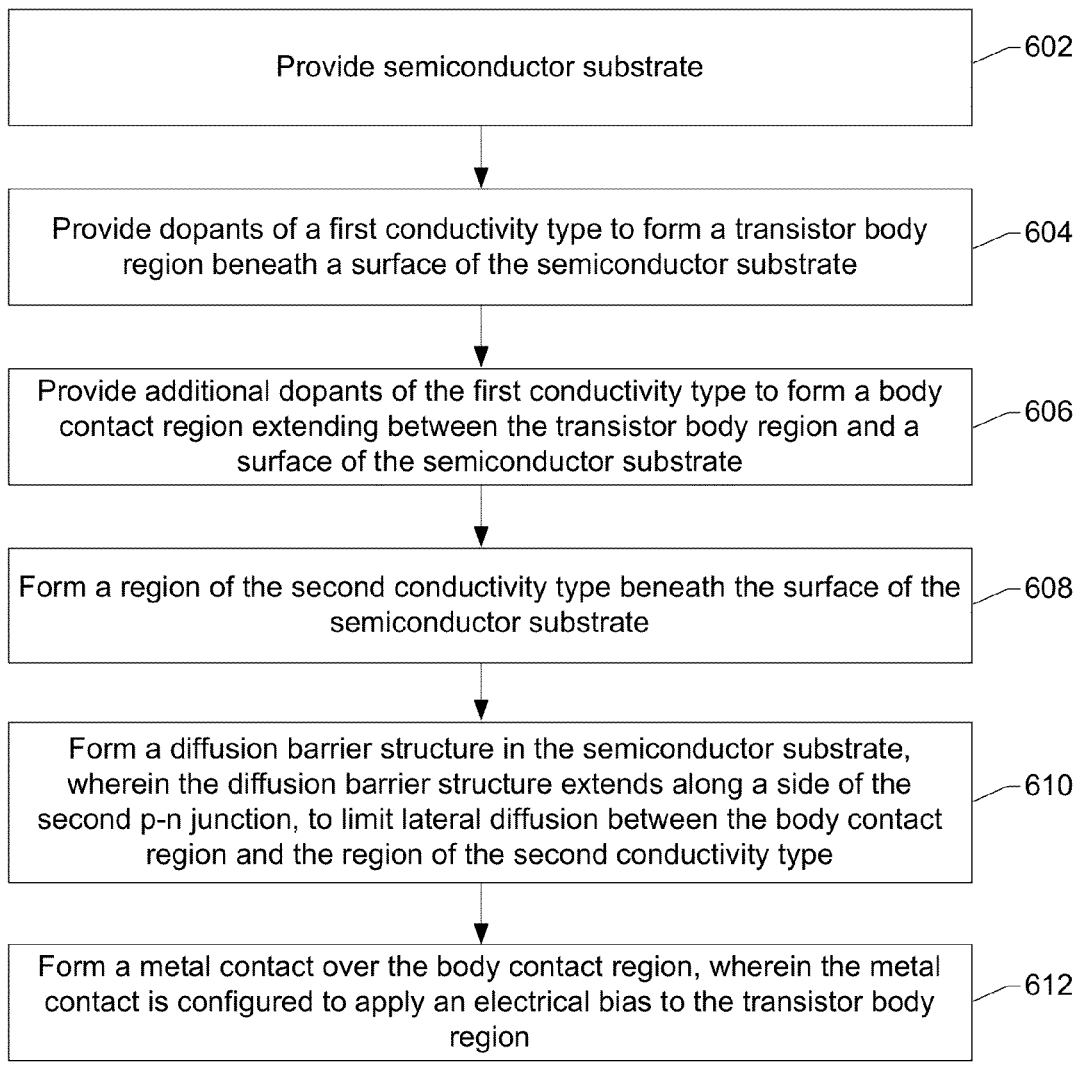
FIG. 6 illustrates some embodiments of methods for measuring lateral diffusion of dopants on a semiconductor wafer.

FIG. 6 shows some embodiments of a method 600 for manufacturing an IC with lateral diffusion barrier structures. Although this method is illustrates as a series of acts, the ordering of these acts is not limited to those illustrated, and the acts can be performed in other orders from what is shown. Further, the each act may be divided into sub-acts, and/or two or more of the illustrated acts can be carried out concurrently in some embodiments.

The method 600 starts at 602 when a semiconductor substrate is provided. It will be appreciated that "semiconductor substrate" or "wafer" as referred to herein may comprise any type of semiconductor material including a bulk silicon wafer, a binary compound substrate (e.g., GaAs wafer), a ternary compound substrate (e.g., AlGaAs), or higher order compound wafers, with or without additional insulating or conducting layers formed thereover, among others. Further, the semiconductor substrate can also include non-semiconductor materials such as oxide in silicon-on-insulator (SOI), partial SOI substrate, polysilicon, insulator, oxide, metal, amorphous silicon, or organic material, among others. In some embodiments, the semiconductor substrate can also include multiple wafers or dies which are stacked or otherwise adhered together. The semiconductor substrate can include wafers which are cut from a silicon ingot, and/or any other type of semiconductor/non-semiconductor and/or deposited or grown (e.g. epitaxial) layers formed on an underlying substrate.

At 604, dopants of a first conductivity type are provided to form a transistor body region, which may also be called in active region or well region in some embodiments, beneath a surface of the semiconductor substrate. This can be accomplished, for example, by patterning a mask over the substrate, and implanting ions through holes in the mask corresponding to the transistor body region. The mask, in the absence of such holes, blocks the ions from reaching the substrate, thereby selectively implanting dopants into the transistor body region and blocking ions from other (masked) substrate regions.

At 606, additional dopants of the first conductivity type are provided to form a body contact region extending between the transistor body region and a surface of the semiconductor substrate. The body contact region typically has a higher dopant concentration than the transistor body region.

At 608, a region of the second conductivity type is formed beneath the surface of the semiconductor substrate. The region of the second conductivity type meets the transistor body region at a first pn junction that extends at least substantially parallel to the surface of the semiconductor substrate. The region of the second conductivity type also meets the transistor body region at a second pn junction that extends at least substantially perpendicular to the surface of the semiconductor substrate.

At 610, a diffusion barrier structure is formed in the semiconductor substrate. The diffusion barrier structure extends along a side of the second p-n junction to limit lateral diffusion between the body contact region and the region of the second conductivity type.

At 612, a metal contact is formed over the body contact region. The metal contact is configured to apply an electrical bias to the transistor body region in an ohmic fashion.

Thus, it will be appreciated that some embodiments relate to an integrated circuit (IC). The IC includes a p-type region formed beneath a surface of a semiconductor substrate. An n-type region, which is also formed beneath the surface of the semiconductor substrate, meets the p-type region at a p-n junction. A diffusion barrier structure, which is formed in the semiconductor substrate and extends along a side of the p-n junction, limits lateral diffusion of dopants between the p-type region and n-type region.

Other embodiments relate to an integrated circuit (IC). The IC includes a transistor body region having a first conductivity type and disposed beneath a surface of a semiconductor substrate. A metal contact is disposed over the transistor body region and is configured to allow a bias to be applied to the transistor body region. A body contact region, which is disposed beneath the surface of the semiconductor substrate, couples the transistor body region to the metal contact. The body contact region has a higher dopant concentration than the transistor body region. A region, which has a second conductivity type opposite the first conductivity type, meets the transistor body region at a first pn junction that extends at least substantially parallel to the surface of the semiconductor substrate. The region which has the second conductivity type also meets the body contact region at a second pn junction that extends at least substantially perpendicular to the surface of the semiconductor substrate. A diffusion barrier structure, which is disposed in the semiconductor substrate and which extends along a side of the second p-n junction, limits lateral diffusion between the body contact region and the region having the second conductivity type.

Still other embodiments relate to a method of manufacturing an integrated circuit. In this method, a semiconductor substrate is provided. Dopants of a first conductivity type are provided to form a transistor body region beneath a surface of the semiconductor substrate. Additional dopants of the first conductivity type are provided to form a body contact region extending between the transistor body region and a surface of the semiconductor substrate. A region of the second conductivity type is formed beneath the surface of the semiconductor substrate. The region of the second conductivity type meets the transistor body region at a first pn junction that extends at least substantially parallel to the surface of the semiconductor substrate. The region of the second conductivity type also meets the transistor body region at a second pn junction that extends at least substantially perpendicular to the surface of the semiconductor substrate. A diffusion barrier structure is formed in the semiconductor substrate. The diffusion barrier structure extends along a side of the second p-n junction to limit lateral diffusion between the body contact region and the region of the second conductivity type.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit (IC), comprising:
   a p-type region formed beneath a surface of a semiconductor substrate;
   an n-type region formed beneath the surface of the semiconductor substrate and meeting the p-type region at a p-n junction; and
   a diffusion barrier structure, which is formed in the semiconductor substrate and extends along a side of the p-n junction, to limit lateral diffusion of dopants between the p-type region and n-type region.

2. The IC of claim 1, wherein the diffusion barrier structure is formed within the n-type region and comprises one or more diffusion bars that are doped n-type and which are more lightly doped than the surrounding n-type region.

3. The IC of claim 1, wherein the diffusion barrier structure is formed within the n-type region and comprises one or more diffusion bars that are doped p-type.

4. The IC of claim 1, wherein the diffusion barrier structure comprises:
   a plurality of diffusion bars, wherein a diffusion bar has a lateral width of approximately 30 nm or more, and wherein neighboring diffusion bars are spaced apart by approximately 20 nm or more.

5. The IC of claim 1, wherein the diffusion barrier structure extends continuously along the side of the p-n junction in the vicinity of a metal contact arranged above and electrically coupled to the p-type region or the n-type region.

6. The IC of claim 1, wherein the semiconductor substrate is a silicon substrate.

7. An integrated circuit (IC), comprising:
a transistor body region having a first conductivity type and disposed beneath a surface of a semiconductor substrate;
a metal contact disposed over the transistor body region and through which a bias is applied to the transistor body region;
a body contact region disposed beneath the surface of the semiconductor substrate and coupling the transistor body region to the metal contact, wherein the body contact region has a higher dopant concentration than the transistor body region;
a region having a second conductivity type, which is opposite the first conductivity type, wherein the region having the second conductivity type meets the transistor body region at a first pn junction that extends at least substantially parallel to the surface of the semiconductor substrate, and wherein the region having the second conductivity type meets the body contact region at a second pn junction that extends at least substantially perpendicular to the surface of the semiconductor substrate; and
a diffusion barrier structure, which is disposed in the semiconductor substrate and which extends along a side of the second p-n junction, to limit lateral diffusion between the body contact region and the region having the second conductivity type.

8. The IC of claim 7, wherein the diffusion barrier structure comprises a plurality of diffusion bars, and where a diffusion bar extends from the surface of the semiconductor substrate to the first pn junction to provide a conductive path between the metal contact and the transistor body region.

9. The IC of claim 7, wherein the diffusion barrier is configured to prevent the region of the second conductivity type from diffusing closer than a predetermined distance from an edge of the metal contact or from diffusing closer than a predetermined distance from an edge of the body contact region.

10. The IC of claim 7, wherein the diffusion barrier is formed within the region of the second conductivity type and comprises one or more diffusion bars that are more lightly doped than the surrounding region of the second conductivity type.

11. The IC of claim 7, wherein the diffusion barrier is formed within the region of the second conductivity type and comprises one or more diffusion bars having the first conductivity type.

12. The IC of claim 7, wherein the diffusion barrier structure comprises:
a plurality of diffusion bars, wherein a diffusion bar has a lateral width of approximately 30 nm or more, and wherein neighboring diffusion bars are spaced apart by approximately 20 nm or more.

13. The IC of claim 7, wherein the semiconductor substrate is a silicon substrate.

14. An integrated circuit (IC), comprising:
a semiconductor substrate having an upper substrate surface;
a metal contact arranged over the upper substrate surface;
a doped contact region arranged in the substrate near the upper substrate surface and abutting a bottom portion of the metal contact, the doped contact region having a first conductivity type;
a region of a second conductivity type disposed near the upper substrate surface and proximate to the contact region;
a well region extending under both the doped contact region and the region of the second conductivity type and being coupled to a channel region of a transistor, wherein the well region has the first conductivity type and is coupled to the metal contact through the doped contact region; and
a diffusion barrier structure extending continuously downward from the upper substrate surface to an uppermost extent of the well region to limit lateral diffusion of dopants from the region of the second conductivity type to the doped contact region.

15. The IC of claim 14, wherein:
the doped contact region includes p-type doping at a first dopant concentration;
region of the second conductivity type includes an n-type doping;
the well region includes p-type doping at a second dopant concentration that is less than the first dopant concentration.

16. The IC of claim 15, wherein the diffusion barrier structure comprises one or more diffusion bars that are doped n-type and which are more lightly doped than the region of the second conductivity type.

17. The IC of claim 15, wherein the diffusion barrier structure comprises one or more diffusion bars that are doped p-type.

18. The IC of claim 15, wherein the diffusion barrier structure comprises:
a plurality of diffusion bars, wherein respective diffusion bars have respective lateral widths of approximately 30 nm, and wherein neighboring diffusion bars are spaced apart by approximately 20 nm.

19. The IC of claim 18, wherein neighboring diffusion bars are separated from one another by regions of the second conductivity type having widths of approximately 20 nm.

20. The IC of claim 14, wherein the well region includes
a lateral well region arranged at a first depth beneath the upper substrate surface and which extends under both the doped contact region and the region of the second conductivity type; and
a vertical well region extending upwardly from the lateral well region to the channel region of the transistor, wherein the lateral well region and vertical well region are continuous with one another.

* * * * *